United States Patent [19]
Sutton et al.

[11] Patent Number: 5,337,338
[45] Date of Patent: Aug. 9, 1994

[54] PULSE DENSITY MODULATION CIRCUIT (PARALLEL TO SERIAL) COMPARING IN A NONSEQUENTIAL BIT ORDER

[75] Inventors: Todd Sutton; Sherman Gregory; Joan T. Waltman; Katherine W. White, all of San Diego, Calif.

[73] Assignee: Qualcomm Incorporated, San Diego, Calif.

[21] Appl. No.: 11,618

[22] Filed: Feb. 1, 1993

[51] Int. Cl.$^5$ ............................................. H03K 21/14
[52] U.S. Cl. ........................................ 377/33; 341/50; 341/53; 341/101; 377/39
[58] Field of Search ................. 341/50, 53, 101; 377/42, 39, 33

[56] References Cited

U.S. PATENT DOCUMENTS

| | | | |
|---|---|---|---|
| 3,719,897 | 3/1973 | Tarr | 377/39 |
| 4,967,283 | 10/1990 | Uchiyama et al. | 341/101 |
| 5,053,769 | 10/1991 | Landmann | 341/53 |
| 5,095,279 | 3/1992 | Quan et al. | 377/42 |

Primary Examiner—Timothy P. Callahan
Assistant Examiner—Shawn Riley
Attorney, Agent, or Firm—Russell B. Miller; Katherine W. White

[57] ABSTRACT

A pulse density modulation circuit has a counter which produces a most significant bit through a least significant bit output based on a clock input. The circuit also has a comparator with two sets of most significant bit through least significant bit inputs that produces an output based on a comparison of the two sets of inputs. The first set of comparator most significant bit through least significant bit inputs receives respectively a most significant bit through a least significant bit of an input reference signal. The second set of comparator most significant bit through least significant bit inputs receives the counter most significant bit through least significant bit output in a non-sequential bit order. The non-sequential bit order can be a bit reversed order wherein the counter most significant bit through least significant bit output are respectively connected to the comparator least significant bit through most significant bit input. The circuit may further filter the comparator output to provide a resultant analog output signal.

16 Claims, 6 Drawing Sheets

PULSE DENSITY MODULATION CIRCUIT (PARALLEL TO SERIAL) COMPARING IN A NONSEQUENTIAL BIT ORDER

BACKGROUND OF THE INVENTION

I. Field of the Invention

The present invention relates to digital signal processing. More particularly, the present invention relates to a novel and improved method for generating a single bit digital signal from a multibit digital signal.

II. Description of the Related Art

In the design of an electrical circuit, a need often arises to convert a multibit digital signal into a single bit digital signal. A typical circuit for performing such a conversion function is comprised of a counter and a comparator. In this configuration the counter is clocked to produce an N-bit counter output value which is provided to one set of inputs to the comparator. An N-bit input value is provided to the other set of comparator inputs. The comparator compares the binary magnitude of the N-bit input value with the binary magnitude of the continuously counting counter value to generate a single bit periodic digital signal. The duty cycle of this resulting single bit digital signal is proportional to the N-bit input value; hence, the term pulse width modulation (PWM) is used.

In addition to the applications of such a signal within a digital circuit, the single bit digital signal also is commonly used to allow digital circuitry to interface with analog circuitry. In this application the single bit digital signal output from the comparator is low-pass filtered to create an analog signal. The purpose of the low-pass filter is to average the discrete levels of the single bit digital signal to produce a constant analog signal output. The duty cycle of the single bit digital signal determines the value of the resulting analog signal at the output of the filter.

The disadvantage of the PWM signal is that within a single cycle all like bits come consecutively, meaning there is no more than one transition from logic value "1" to logic value "0" and from logic value "0" to logic value "1" per period. The single rising and falling edge results in the limitation of applications of such a signal within a digital circuit.

If the single bit signal is converted to analog, this disadvantage also adversely affects the characteristics of the analog signal created. To keep the analog signal output from increasing during the portion of the PWM period that is logic value "1" and then decreasing during the portion of the PWM period that is logic value "0", the low-pass filter selected must have a low cutoff frequency. However the low cutoff frequency also slows the reaction time of the analog signal output to changes in the value of the input digital signal.

It is therefore the objective of the present invention to provide a novel and improved apparatus and method for converting a multibit digital signal into a single bit digital signal.

It is yet another object of the present invention to provide a circuit and method for converting a multibit digital signal to an analog signal with an improved relationship between the alternating current (AC) component on and response time of the resulting analog signal.

SUMMARY OF THE INVENTION

The present invention is a novel and improved apparatus and method for generating an enhanced single bit digital signal. In applications where it is necessary to convert a multibit digital signal to a single bit digital signal, the present invention produces a single bit digital signal with improved characteristics at no added cost.

In accordance with the present invention, circuitry for generating a single bit digital signal from a multibit digital signal is disclosed. The circuitry is comprised of a counter means and a comparator means. The counter means counts sequentially and continuously and is coupled to one of the comparator means inputs. The second comparator means input receives a multibit digital signal that corresponds to the value of the single bit signal being generated.

The improvement of the present invention is the effect of the manner in which the counter means output is coupled to the comparator means input. The counter means output is coupled to the comparator means input in a non-sequential order; wherein, the most significant bit (MSB) through the least significant bit (LSB) outputs of the counter means are not connected to respectively the MSB through LSB inputs of the comparator means. The advantage of this configuration is that within a single period of the resulting single bit digital signal, all like bits do not come consecutively. This allows the single bit output to have many transitions between logic values "0" and "1" within a single period. The single bit output can be used in applications where a variable rate digital signal is needed. If the single bit signal is passed through a low-pass filter, then the resulting analog signal has a reduced AC component on average since the energy of the digital signal is spread over the entire period.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

In the design of an electrical circuit, a need often arises to convert a multibit digital signal to a single bit digital signal. In a typical configuration the resulting single bit digital signal varies in duty cycle to represent the corresponding value of the multibit digital signal; hence, the term pulse width modulation (PWM) is used. The single bit digital signal can be low-pass filtered to obtain an analog signal.

Figure 1:
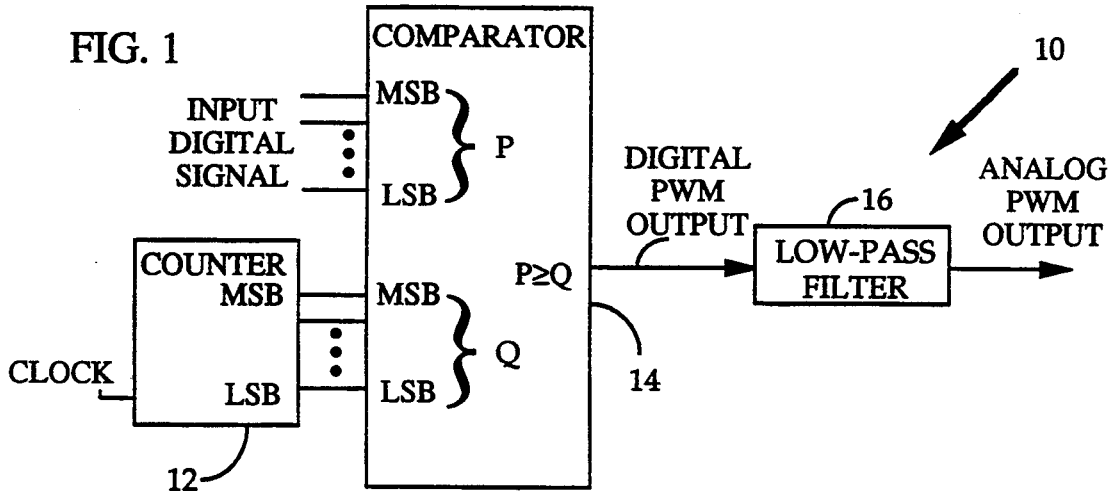
FIG. 1 is a block diagram illustrating a typical configuration for creating a digital pulse width modulated signal (PWM) and resulting analog signal.

FIG. 1 illustrates how a typical PWM system 10 may be configured. PWM system 10 is comprised of counter 12, comparator 14 and optionally of low-pass filter 16. Counter 12 is typically an N bit binary counter which is configured as a cyclical counter. An exemplary counter is one sold under the part number LS163. As such, counter 12 receives an input clock signal and provides a series of incremental valued count signals with a period $T_p$, where $T_p$ is typically $2^N$ times period of the clock. Counter 12 is coupled to N-bit comparator 14. More specifically the most significant bit (MSB) through least significant bit (LSB) outputs of counter 12 are coupled respectively to the MSB through LSB inputs of one set of N-bit inputs (Q) of comparator 14.

Comparator 14 also has at a second set of N-bit inputs (P) which receives the multibit input digital signal that is to be converted to a single bit signal. The P inputs of comparator 14 are also configured in an MSB to LSB arrangement for receiving respectively the MSB through LSB of the input digital signal. Comparator 14 generates a single bit digital output signal by making a comparison of the magnitude of two inputs P and Q. An exemplary comparator is one sold under the part number LS682. The ratio in duration in the logical values of the PWM signal, i.e., the duty cycle, from comparator 14 is a direct function of the value of the input digital signal. This single bit signal may be low-pass filtered by filter 16.

Figure 2:
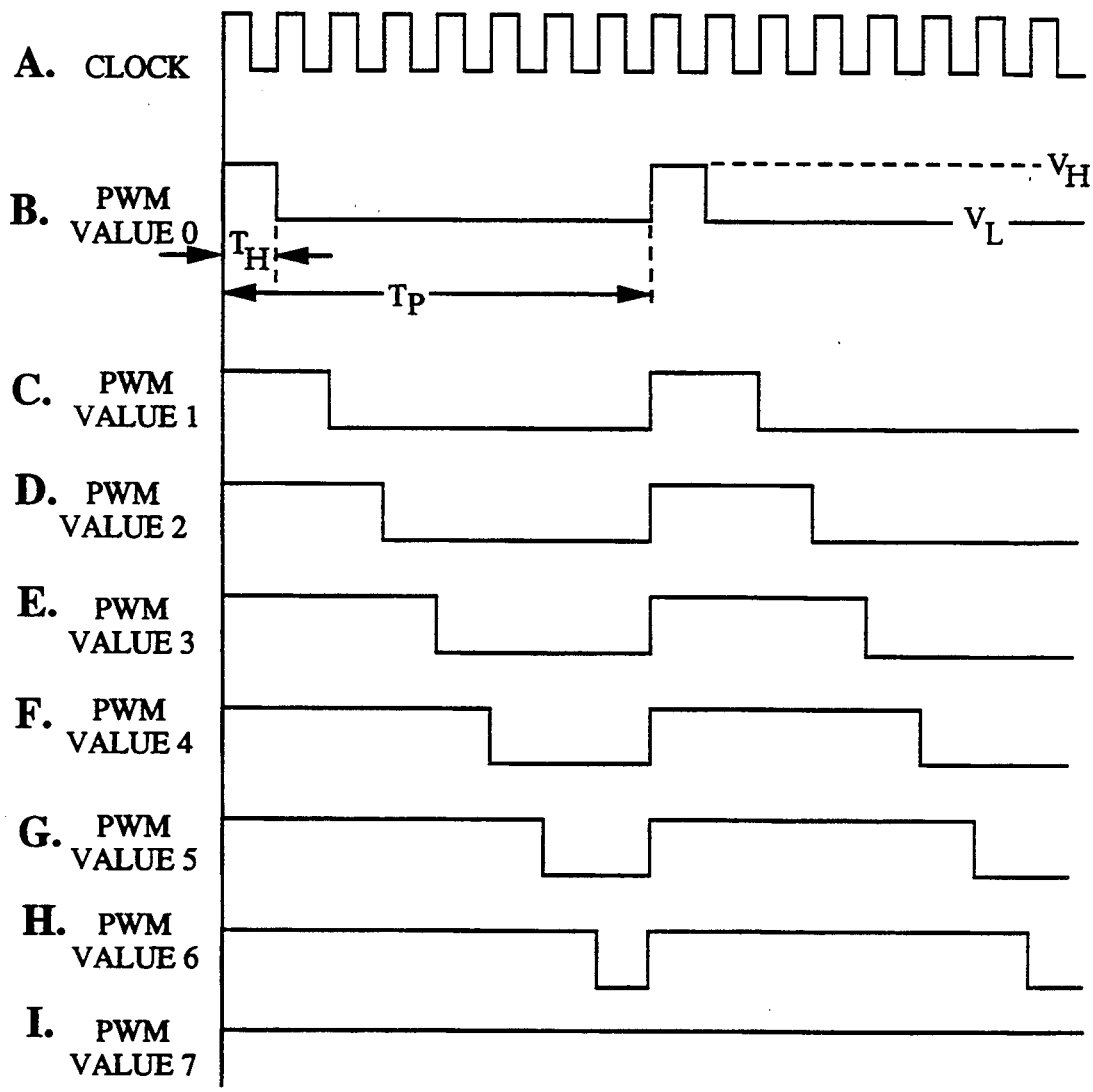
FIG. 2 is a series of graphs A-I illustrating the eight possible states of a PWM signal.

FIG. 2 illustrates in a series of graphs A–I a clock signal and resulting PWM signals where N=3. The period of the counter, $T_p$, is eight ($2^N$) clock cycles. As can be seen in FIG. 2, graph B, for a binary input digital signal of "000", the resulting PWM is of a logical value "1" for the period of $T_h$ which is equal to the period of one clock cycle. The PWM is then a logical value "0" for the remainder of the counter period i.e., $T_p-T_h$. In comparison in FIG. 2, graph F for a binary input digital signal of "100", the resulting PWM is of a logical value "1" for five clock cycles and logical value "0" for the remaining three clock cycles in the period $T_p$. In this example the comparison made was P≧Q, but the magnitude comparison can be P>Q, P<Q, P ≧Q, P≦Q, or logical inverse of any of the four. The selected comparison chooses whether the all logical value "1" or all logical value "0" is included as a valid output. It also changes the mapping of input digital signals to output PWM signals, but the basic set of signals remains the same.

To get the full range of eight values at the output of comparator 14, the input digital signal must contain at least three bits. It should be noted that there is no need for synchronism between changes in value of the input digital signal with respect to a specific state of the counter. However it is desirable, although not necessary, that each input digital signal be applied for at least the duration $T_p$ before being changed again for optimal accuracy in conversion.

The PWM signal output from comparator 14 may be low-pass filtered by filter 16. Through low-pass filtering, the PWM signal becomes an analog signal proportional to the average value of the original PWM signal. If a lossless, passive, low-pass filter is used, then the average analog value ($V_{ave}$) Of the PWM signal is defined by:

$$V_{ave} = \frac{T_h}{T_p} \cdot (V_h) + \frac{T_p - T_h}{T_p} \cdot (V_l) \quad (1)$$

where:

$T_h$ is the length of time that the signal is logic value "1;"

$T_p$ is the length of time of the entire period;

$V_h$ is the voltage level at logic value "1;" and $V_l$ is the voltage level at logic value "0."

The disadvantage of the PWM signal is that all like bits within one period come consecutively. For example, in FIG. 2, graphs B–I, the first clock cycle of each period, $T_p$, is always logic value "1." At some point in the period the signal may change to logic value "0." In no case does it then change back to logic value "1" until the beginning of the next period. Therefore there is never more than one rising edge and one falling edge in the period, $T_p$. This fixed number of logical transitions limits the uses of such a signal.

The single rising edge and falling edge of the PWM signal also adversely affects the resulting analog signal if the PWM is low-pass filtered. Low-pass filter 16 can be used to average the PWM signal over the period, $T_p$, to produce an analog signal. For example, if the input to the filter were at PWM value 4 (FIG. 2, graph F), the cutoff frequency of low-pass filter 16 could be chosen sufficiently low so that the analog signal is the same level for the first five clock cycles of counter period, $T_p$, while the PWM signal is logic value "1" as it is for next three clock cycles while the signal is logic value "0." The disadvantage is realized when the PWM signal changes values, i.e., the selected output changes from PWM value 4 (FIG. 2, graph F) to PWM value 3 (FIG. 2 graph E). The relatively low cutoff frequency will delay the reaction of the analog signal to changes in value of the PWM signal in the same manner that it smoothes the reaction of the analog output to the discrete levels of the PWM signal within a single period. The desired analog signaling requirements must determine the specific design criteria of low-pass filter 16. If the cutoff frequency is low then the analog signal has a negligible AC content in the steady-state; however, the reaction time of the analog signal to changes in the PWM signal is delayed. Inversely if the cutoff is high then the analog signal may have a considerable AC content in the steady-state, but the reaction of the analog signal to changes in value of the PWM signal is more immediate.

The present invention creates a single bit digital signal with improved characteristics using the same basic elements. The enhanced single bit digital signal contains many rising and falling edges on average in a single period. The increased number of logical transitions results in a signal where the discrete logic values are spread more evenly over the period. The value represented by this improved signal is directly related to the total number of clock cycles throughout the period where the logic value is "1;" hence, the term pulse density modulation (PDM) is applied.

Figure 3:
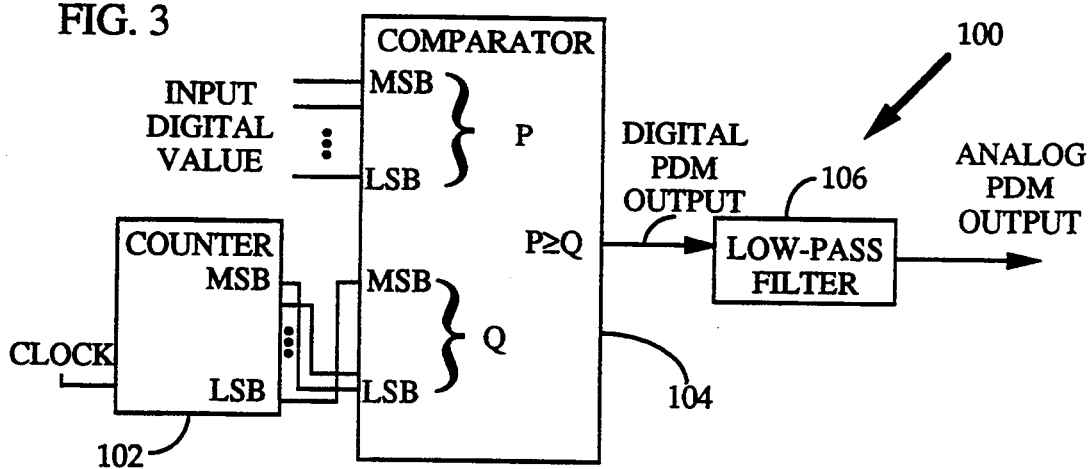
FIG. 3 is a block diagram illustrating an exemplary configuration for creating a digital pulse density modulated (PDM) signal and resulting analog signal according to the present invention.

FIG. 3 illustrates an exemplary configuration of a PDM system. PDM system 100 is comprised of counter 102, comparator 104, and optionally of low-pass filter 106. Counter 102 is typically an N-bit binary counter which is again configured as a cyclical counter. As such, counter 102 receives an input clock signal and provides a series of incremental valued count signals with a period $T_p$, where $T_p$ is again typically $2^N$ times period of the clock. The improvement of the present invention is the result of the non-sequential bit order connection of counter 102 to comparator 104. In this example, the N-bit output of counter 102 is coupled to the N-bit input (Q) of comparator 104 in a bit reversed order; wherein, the MSB through LSB output of counter 102 is respectively connected to the LSB through MSB input of comparator 104. As a result, comparator 104 does not receive the series of count signals in numerical order.

Comparator 104 also has a second set of N-bit inputs (P) which receives the multibit digital input signal that is to be converted to a single bit signal. The P inputs of comparator 104 are configured in an MSB to LSB arrangement for receiving respectively the MSB through LSB of the input digital signal. Comparator 104 generates a single bit digital output signal representative of the magnitude comparison of the bit reversed output signal of counter 102 to the input digital signal. The ratio of the total time during one period that the output signal is at logic value "1" to the total time of the period $T_p$ is a direct function of the input digital signal. The single bit signal may then be low-pass filtered by filter 106.

Figure 4:
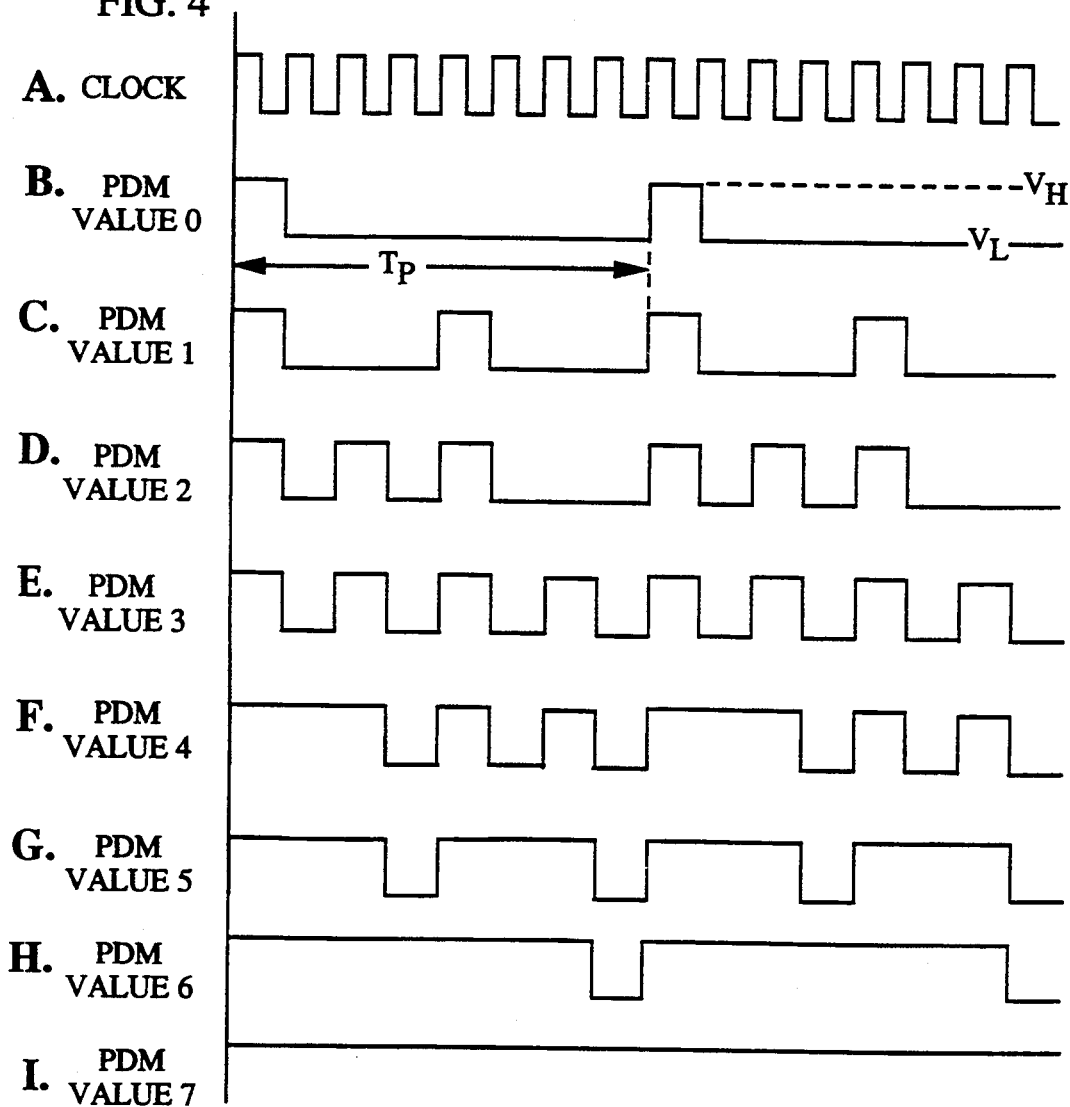
FIG. 4 is a series of graphs A-I illustrating eight possible states of a PWM signal.

FIG. 4 illustrates in a series of graphs A–I, a clock signal and resulting PDM signals where N=3. In this example the period of the counter, $T_p$, is again eight clock cycles. To illustrate the difference between a PWM and a PDM, a comparison of like valued signals can be made. In FIG. 2, graph F, a level 4 PWM is shown for a binary input digital signal of "100." The PWM is a logical value "1" for five clock cycles and logical value "0" for the remaining three clock cycles in the period, $T_p$. In contrast in FIG. 4, graph F, a level 4 PDM is shown for the same binary input digital signal of "100." Since comparator 104 receives the series of count signals as "0,4,2,6,1,5,3,7" due to the bit inversion, the PDM follows the logic series "11101010," thus providing three rising edges and spreading the logic values more evenly over the entire period. Note that the number of clock cycles spent at each logic value is the same for the PDM and the PWM.

As can be seen in FIG. 4, graph B, for a binary input digital signal of "000", the resulting PDM is logic value "1" for the period of one clock cycle, then PDM is logic value "0" for the remainder of the period, $T_p$. For this case where there is just one clock cycle where the logic value is different than the remainder of the period (FIG. 2, graphs B and H, and FIG. 4, graphs B and H) and in the case where the logic value is the same for the entire period (FIG. 2, graph I and FIG. 4, graph I), the present circuit can provide no improvement. In most systems, N is much larger than 3; hence, the number of these special case values is small compared to the total number of possible values. There are no values where the PDM affords a disadvantage compared to the PWM.

Figure 11:
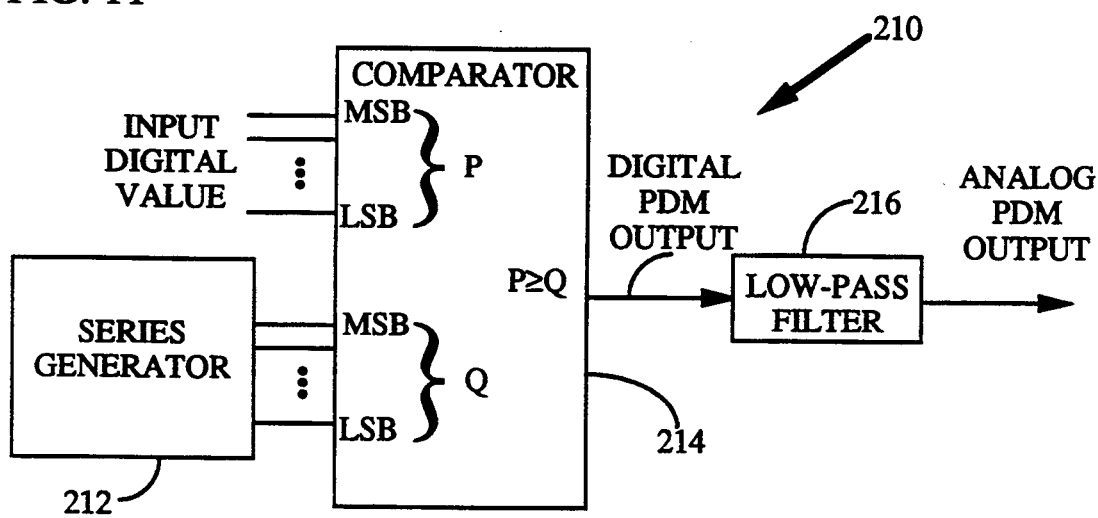
FIG. 11 is a block diagram illustrating an alternative configuration for creating a digital PDM signal and resulting analog signal.

In PDM system 100, counter 102 is connected to comparator 104 in a bit reversed order. However this inverted order is not the only order that could be chosen to create a PDM signal. Any order chosen will cause more transitions per period on average than the sequential connection of the MSB through LSB output of counter 102 to the MSB through LSB input of comparator 104. Furthermore, it is no longer necessary that the series of comparison signals be generated by a standard counter. Any device capable of outputting a series of non-sequential multibit signals at a predetermined rate could be used. A series of fixed values could be chosen and then stored in software or hardware. Alternatively, a PDM system could be generated by randomly selecting comparator inputs from a set of valid signals. FIG. 11 illustrates how such a PDM system 210 may be configured. Series generator 212 provides the non-sequential series of signals to the Q inputs of comparator 214 with the remainder of PDM system 210 being substantially the same as PDM system 100. The majority of this description deals directly with PDM system 100 where counter 102 is connected to comparator 104 in a bit reversed order, but advantages of the PDM apply no matter how the signal is created.

Although it is not required that counter 102 and the digital input signal have the same number of bits, to get the full range of values at the output of the comparator, the input digital signal must contain at least the same number of bits as the counter. It should be also noted that there is no need for synchronism between changes in value of the input digital signal with respect to a specific state of the counter. However it is desirable although not necessary that each input digital signal be applied for at least the duration $T_p$ before being changed again for optimal accuracy in conversion.

In the FIG. 3 and FIG. 4, the comparison made was P≧Q, but again the magnitude comparison can be P>Q, P<Q, P≧Q, P≦Q or the logical inverse of any of the four. The selected comparison chooses whether the all logical value "1" or all logical value "0" is included as a valid output. It also changes the mapping of input digital signals to output PDM signals, but the basic set of signals remains the same.

One advantage of the PDM signal over the PWM signal is its wide range of uses. In addition to serving as a multibit to single bit converter, the PDM signal could be used as a variable rate signal generator. Based on the fixed clock which drives counter 102, a new signal with a controllable number of rising edges in a given period is generated. The number of rising edges is directly related to the input digital signal.

The PDM signal, with its energy spread more evenly over the period, $T_p$, also affords an advantage when the signal is converted to an analog signal through filtering. Through low-pass filtering the PDM signal becomes an analog signal proportional to the average value of the original PDM signal. If a lossless, passive, low-pass filter is used then the average analog value ($V_{ave}$) Of the PDM signal is defined by:

$$V_{ave} = \frac{\Sigma T_h}{T_p} \cdot (V_h) + \frac{T_p - \Sigma T_h}{T_p} \cdot (V_l) \qquad (2)$$

where:

$\Sigma T_h$ is the total length of time the signal is logic value "1;"

$T_p$ is the length of time of the entire period;

$V_h$ is the voltage level at logic value "1;" and $V_l$ is the voltage level at logic value "0."

A PWM and a PDM with the same N, $T_p$, $V_h$, $V_l$ and input digital value produce the same $V_{ave}$. The advantage of the PDM over the PWM is that a more favorable relationship between the steady-state, peak-to-peak AC ripple on the analog signal and the reaction time of the analog signal to changes in value of the digital input signal can be realized. The following examples help to illustrate this PDM advantage.

Figure 5:
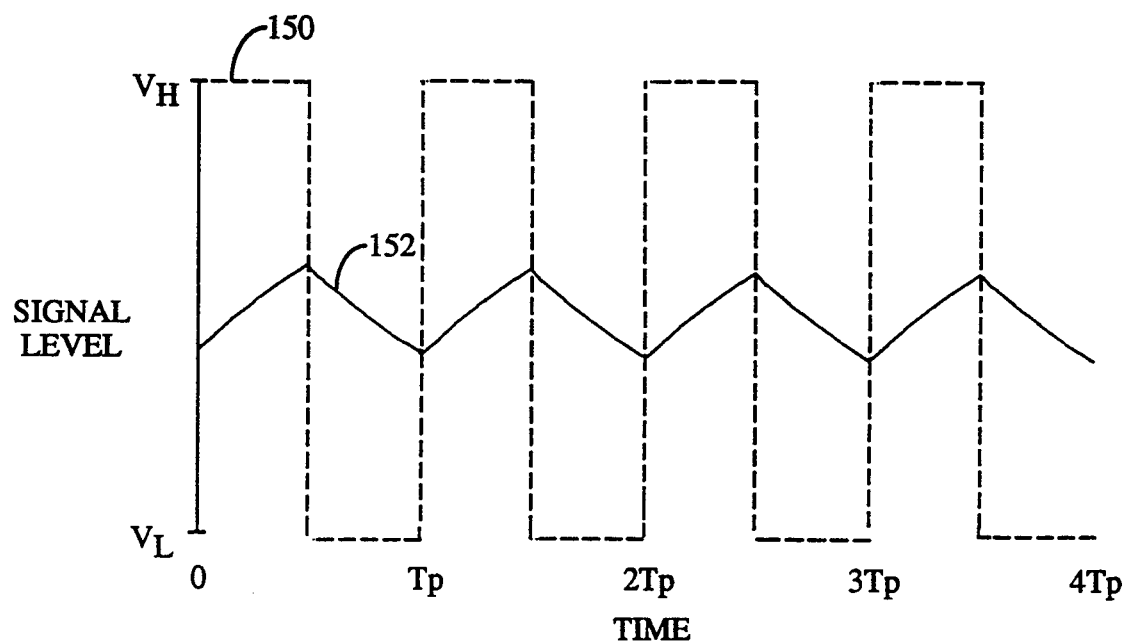
FIG. 5 is an example of a PWM signal and resulting analog signal when the PWM signal is passed through a low-pass filter.

FIG. 5 illustrates in graphical form a PWM signal, curve 150, and the resulting steady-state analog signal, curve 152, produced when the PWM signal is passed through a lossless, passive, low-pass filter. FIG. 5, curve 150 represents four cycles of the PWM signal of FIG. 2, graph E. The PWM signal is value 3, where the period of each cycle is $T_p$, the voltage level at logic value "1" is $V_h$, the voltage level at logic value "0" is $V_l$, and N=3. The resultant analog signal has an average DC value equal to 50% of the total range, i.e., $(V_h-V_l)/2$. It also has an AC content with a peak-to-peak value of approximately 20% of the total range.

Figure 6:
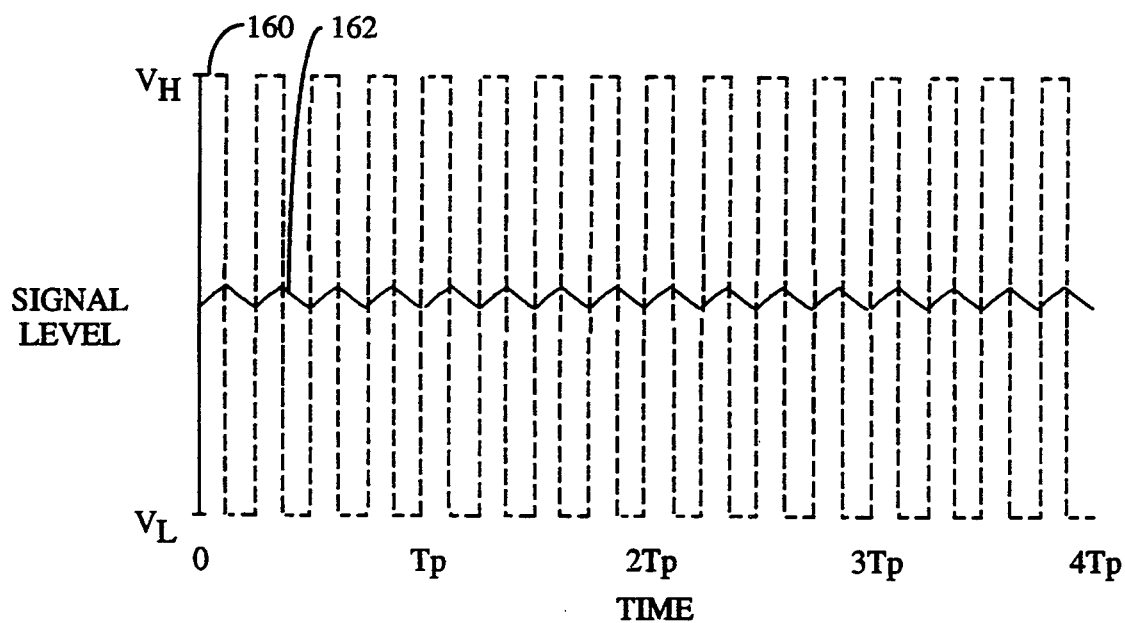
FIG. 6 is an example of a PDM signal and resulting analog signal when the PDM signal is passed through the same filter as FIG. 5.

FIG. 6 illustrates in graphical form a PDM signal, curve 160, and the resulting steady-state analog signal, curve 162, produced when the PDM signal is passed through a lossless, passive, low-pass filter. FIG. 6 represents four cycles of the PDM signal of FIG. 4, graph E. The PDM signal is value 3, where the period of each cycle is $T_p$, the voltage level at logic value "1" is $V_h$, the voltage level at logic value "0" is $V_l$, and N=3. FIG. 6 shows the resultant analog signal when the PDM signal is passed through the same filter as the PWM signal of FIG. 5. Note that the average DC value equal to 50% of the total range is common to both the analog signals (FIG. 5 and FIG. 6) but that the peak-to-peak AC content of the PWM analog signal in FIG. 5 is four times larger than the peak-to-peak AC content of the PDM analog signal in FIG. 6. The improvement in AC content gained by the PDM signal over the PWM signal depends on the value of the input digital signal, the number of bits (N), and the low-pass filter.

Figure 7:
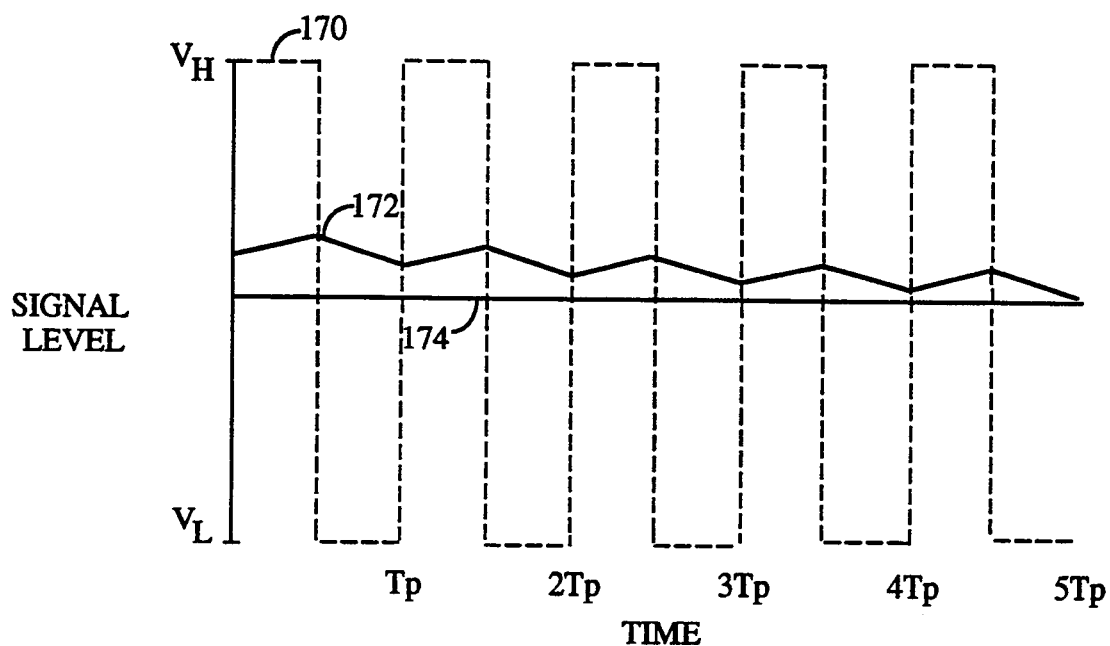
FIG. 7 is an example of a PWM signal and resulting analog signal immediately following a change in the input digital value.
Figure 8:
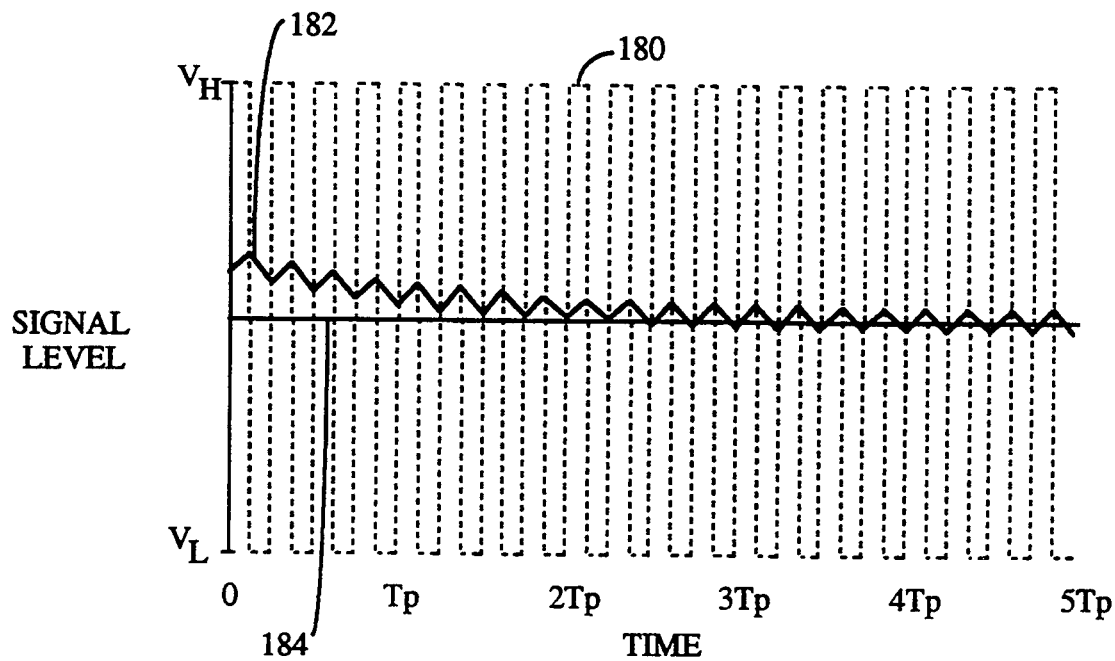
FIG. 8 is an example of a PDM signal and resulting analog signal immediately following a change in the input digital value.

The reaction time of the PWM analog signal in FIG. 5 and the PDM analog signal in FIG. 6 to changes in value of the input digital signal would be the same since the same filter is used for both. In FIGS. 7 and 8, the converse situation is examined. In FIG. 7 the reaction time of the PWM analog signal has been forfeited to allow the PWM analog signal to have the same steady-state, peak-to-peak AC content as the PDM analog signal of FIG. 8.

FIG. 7 shows five cycles of a PWM signal, curve 170, and the resulting analog signal, curve 172, produced immediately following a change in value of the PWM signal. At time equal to 0, a change from PWM value 4 (FIG. 2, graph F) to PWM value 3 (FIG. 2, graph E) has been made. In FIG. 7 the new value of the PWM signal, curve 170, is passed through a lossless, passive, low-pass filter with curve 172 illustrating the resulting analog signal at the output of the low-pass filter. In FIG. 7, line 174 is shown for reference purposes and represents the desired steady-state DC value. After five clock periods i.e., time=$5T_p$, curve 172 has not achieved the desire steady-state value.

FIG. 8 shows five cycles of a PDM signal, curve 180, and the resulting analog signal, curve 182, produced immediately following a change in value of the PDM signal. At time equal to 0, a change from PDM value 4 (FIG. 4, graph F) to PDM value 3 (FIG. 4, graph E) has been made. In FIG. 8 the new value of the PDM signal, curve 180, is passed through a lossless, passive, low-pass filter. The low-pass filter used in FIG. 8 has a higher cutoff frequency than the low-pass filter used in FIG. 7. The cutoff frequency was chosen so that the steady-state, peak-to-peak AC content would be the same for the PDM analog signal of FIG. 8 as that of the PWM analog signal of FIG. 7. In FIG. 8, curve 182 illustrates the PDM analog output signal of this different low-pass filter. In FIG. 8, line 184 is shown for reference purposes and represents the desired steady-state DC value. In contrast to the PWM analog signal of FIG. 7, the PDM analog signal of FIG. 8 is changing four times faster and has nearly achieved the desired steady-state value after only four clock periods, i.e., time=$4T_p$.

Figure 9:
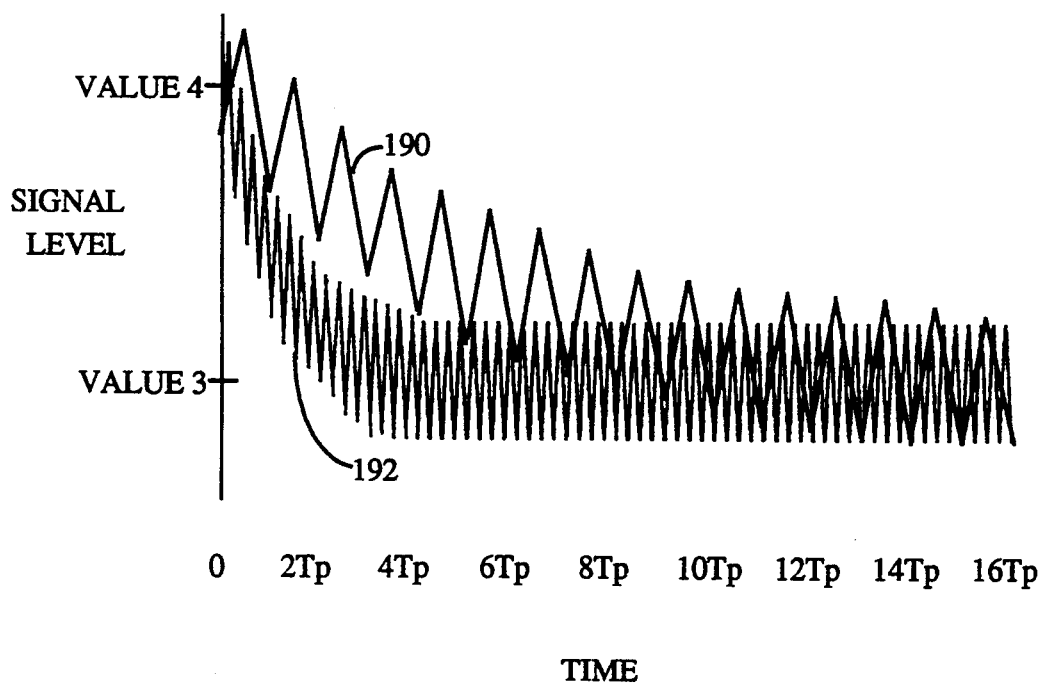
FIG. 9 is a graphical comparison of the resulting analog signals from FIGS. 7 and 8 with the time base extended.

To more precisely examine the difference in reaction time between the PWM analog signal (FIG. 7) and the PDM analog signal (FIG. 8), FIG. 9 superimposes these two signals on a single graph with an extended time axis. In FIG. 9, curve 190 is the slower reacting PWM analog signal to FIG. 7 while curve 192 is the faster reacting PDM analog signal of FIG. 8. The two signal levels labeled on the y-axis correspond to the average value of both the PWM and PDM at level 3 (($T_h$-$V_l$)/2) and level 4 ($5*(T_h-V_l)/8$). After 16 clock periods, i.e., time=$16T_p$, the PWM signal has reached the same steady-state value that the PDM reached after only 4 clock cycles. FIG. 9 also illustrates that the steady-state, peak-to-peak AC content of the two signals is indeed the same.

Figure 10:
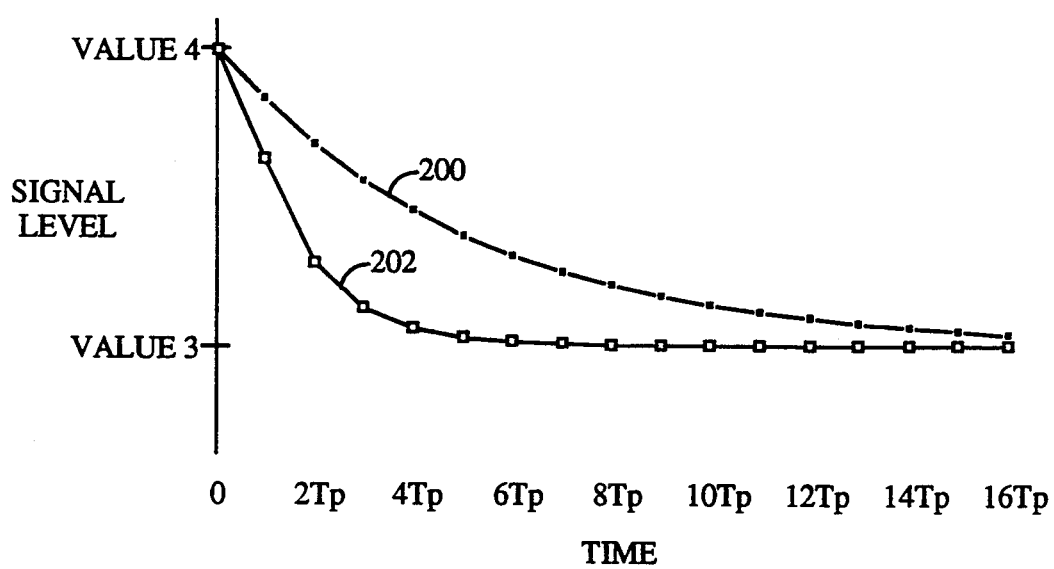
FIG. 10 is a graphical comparison of the average value of each period of the analog signals from FIG. 9.

To more explicitly illustrate the results of FIG. 9, FIG. 10 graphs the average value of each period of curves 190 and 192 of FIG. 9. FIG. 10 clearly shows the PDM analog signal, curve 202, settling in approximately a quarter of the time in which the PWM analog signal, curve 200, settles. The improvement in settling time gained by the PDM over the PWM signal depends on the value of the input digital signal, the number of bits (N), and the low-pass filter.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A pulse density modulation circuit comprising:

counter means for generating a series of incremental value count signals, each count signal having a most significant bit through a least significant bit; and comparator means for receiving a reference signal having a most significant bit through least significant bit, comparing the reference signal with the series of count signals wherein the reference signal most significant bit through least significant bit is compared in a non-sequential bit order of the count signal most significant bit through least significant bit, and providing a single bit signal.

2. The circuit of claim 1 wherein the non-sequential bit order is a bit reversed order wherein the reference signal most significant bit through least significant bit is compared respectively with the count signal least significant bit through most significant bit.

3. The circuit of claim 1 further comprising filter means for filtering the single bit signal.

4. The circuit of claim 2 further comprising filter means for filtering the single bit signal.

5. A pulse density modulation circuit comprising:
 a counter having a clock input for receiving a clock signal and a most significant bit output through a least significant bit output; and
 a comparator having a first set of most significant bit through least significant bit inputs for respectively receiving a most significant bit through a least significant bit of an input reference signal and a second set of most significant bit through least significant bit inputs connected to the counter most significant bit output through least significant bit output in a non-sequential bit order, and an output.

6. The circuit of claim 5 wherein the non-sequential bit order is a bit reversed order wherein the counter most significant bit output through least significant bit output are respectively connected to the least significant bit input through the most significant bit input of the comparator second set of inputs.

7. The circuit of claim 5 further comprising a low-pass filter having an input connected to the comparator output and an output.

8. The circuit of claim 6 further comprising a low-pass filter having an input connected to the comparator output and an output.

9. A multibit to single bit signal converter comprising:
 means for providing a series of non-sequential values at a predetermined rate; and
 means for comparing a multibit input value with the series of non-sequential values to provide a resultant single bit signal.

10. The converter of claim 9 further comprising filter means for filtering the resultant single bit signal to provide a resultant analog signal.

11. A method for creating pulse density modulated signal comprising the steps of:
 providing a series of incremental value count signals, each count signal having a most significant bit through a least significant bit;
 receiving a reference signal having most significant bit through least significant bit;
 comparing the reference signal with the series of count signals wherein the reference signal most significant bit through least significant bit is compared in a non-sequential bit order of each count signal most significant bit through least significant bit; and
 providing a corresponding single bit signal.

12. The method of claim 11 wherein the non-sequential bit order is a bit reversed order wherein the reference signal most significant bit through least significant bit is compared respectively with the count signal least significant bit through most significant bit.

13. The method of claim 11 further comprising the step of filtering the single bit signal.

14. The circuit of claim 12 further comprising the step of filtering the single bit signal.

15. A method of multibit to single bit signal conversion comprising the steps of:
 providing a series of non-sequential values at a predetermined rate; and
 comparing a multibit reference value with the series of non-sequential values to provide a corresponding single bit output signal.

16. The method of claim 15 further comprising the step of filtering said corresponding single bit output signal.

* * * * *